(12) United States Patent
Endo et al.

(10) Patent No.: US 7,199,789 B2
(45) Date of Patent: Apr. 3, 2007

(54) INPUT APPARATUS HAVING ELECTROSTATIC SENSOR

(75) Inventors: Yoshihisa Endo, Fukushima-ken (JP); Kunio Sato, Fukushima-ken (JP); Masahiro Soma, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 511 days.

(21) Appl. No.: 10/738,823

(22) Filed: Dec. 17, 2003

(65) Prior Publication Data
US 2004/0130527 A1 Jul. 8, 2004

(30) Foreign Application Priority Data
Dec. 20, 2002 (JP) ............................. 2002-369538
Dec. 20, 2002 (JP) ............................. 2002-369539

(51) Int. Cl.
*G09G 5/00* (2006.01)
(52) U.S. Cl. ..................... 345/173; 345/174; 178/18.06
(58) Field of Classification Search ........ 345/173–179; 178/18.01, 18.05; 340/562
See application file for complete search history.

(56) References Cited

U.S. PATENT DOCUMENTS 4,103,252 A * 7/1978 Bobick ......................... 331/48
5,148,149 A * 9/1992 Campbell et al. ........... 340/562
5,554,973 A * 9/1996 Kawashima et al. ........ 340/562
5,640,628 A * 6/1997 Yoshida ....................... 396/311
5,923,320 A * 7/1999 Murakami et al. .......... 345/179
6,310,611 B1 10/2001 Caldwell
6,710,629 B2 * 3/2004 Lee .............................. 327/58
2006/0132332 A1* 6/2006 Ono ............................. 341/33

FOREIGN PATENT DOCUMENTS

JP 3020736 1/2000

* cited by examiner

*Primary Examiner*—Regina Liang
(74) *Attorney, Agent, or Firm*—Brinks Hofer Gilson & Lione

(57) ABSTRACT

An input apparatus having a reduced-size electrostatic sensor that can precisely detect an input and then output a signal and, thus, has excellent responsiveness and reliability contains the following: clock signal generating means for generating clock signals; delaying means for generating delayed signals by delaying the signal rise time of the clock signal according to the capacitance detected when a human appendage approaches or contacts the electrostatic sensor; AND means for receiving the clock signal and the delayed signal as input signals and then outputting these signals as an output signal; and smoothing means for smoothing and outputting the output of the analog switch.

2 Claims, 5 Drawing Sheets

DRIVING WAVE CK

DETECTING VOLTAGE
FOR ANALOG OUTPUT

FIG. 5A DRIVING WAVE CK
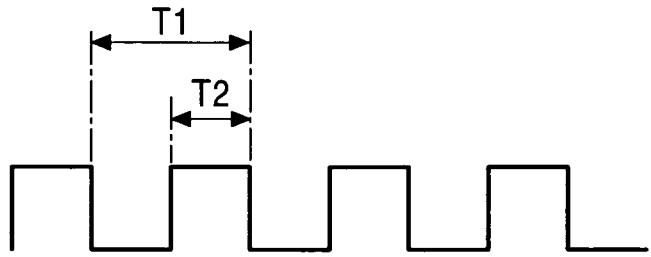
FIG. 5B ANALOG OUTPUT WITHOUT FINGER IN CONTACT
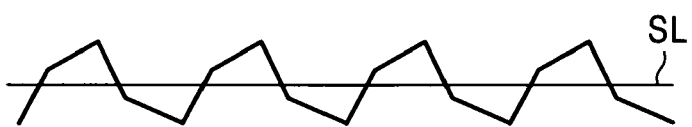
FIG. 5C AND OUTPUT WITHOUT FINGER IN CONTACT
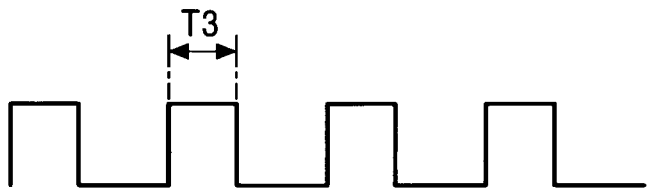
FIG. 5D ANALOG OUTPUT WITH FINGER IN CONTACT
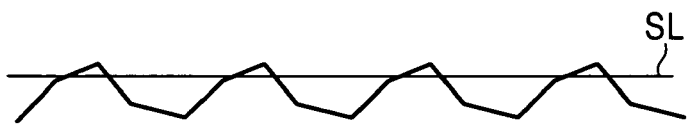
FIG. 5E AND OUTPUT WITH FINGER IN CONTACT
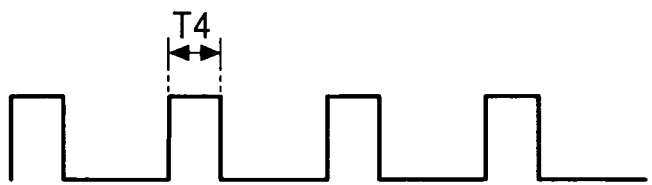

INPUT APPARATUS HAVING ELECTROSTATIC SENSOR

This application claims the benefit of priority to Japanese Patent Application Nos. 2002-369538 and 2002-369539, herein incorporated by reference.

BACKGROUND OF THE INVENTION

1. Field of the Invention

The present invention relates to an input apparatus having an electrostatic sensor. More specifically, it relates to an input apparatus having an electrostatic sensor that detects the capacitance generated by a human appendage, such as a hand or finger, approaching or contacting the sensor and that outputs an electrical signal.

2. Description of the Related Art

FIGS. 6A and 6B show part of a typical electrostatic sensor. FIG. 6A is a plan view of an electrostatic sensor. FIG. 6B shows output signals of the electrostatic sensor.

As shown in FIG. 6A, the electrostatic sensor 50 has two electrodes 51 and 52 for detecting capacitance. The surface of the electrodes 51 and 52 is covered with an insulating sheet. In FIG. 6A, however, the insulating sheet is not shown.

A predetermined voltage is applied to the electrodes 51 and 52. When a moveable body H, such as the user's finger or an input pen, contacts the surface of the insulating sheet covering the electrodes 51 and 52, a capacitance C is generated between the electrodes 51 and 52 that oppose the moveable body H. When the area where the moveable body H and the electrode 51 face each other is S1, the area where the moveable body H and the electrode 52 face each other is S2, the distance between the moveable body and each of the electrodes is d, and the permittivity is $\epsilon$, the capacitance C1 generated between the moveable body H and the electrode 51 is $C1 = \epsilon \cdot S1/d$, and the capacitance C2 generated between the moveable body H and the electrode 52 is $C2 = \epsilon \cdot S2/d$. Moving the moveable body H in the X1 or X2 direction, shown in the drawing, changes the areas S1 and S2. For this reason, the capacitances C1 and C2 can be changed.

The electrostatic sensor 50 has a C/V converting means (not shown in the drawing) for converting the capacitance C into voltage. The C/V converting means enables the electrostatic sensor 50 to detect the capacitances C1 and C2, which change with time due to the movement of the moveable body H.

When the moveable body H, such as a finger, moves in the X2 direction, shown in the drawing, signals V1 and V2 are as shown in FIG. 6B. Here, V1 is the voltage signal converted from the capacitance C1 by the C/V converting means and V2 is the voltage signal converted from the capacitance C2 by the C/V converting means.

When a controller, not shown in the drawing, first detects the signal V1 and, then, the signal V2, the moveable body H is detected to be moving in the direction from X1 to X2, as shown in the drawing. On the contrary, when the signal V2 is detected first and the signal V1 is detected next, the moveable body H is detected to be moving in the direction from X2 to X1, as shown in the drawing.

The controller, for example, controls the movement of a cursor on a display, based on the detected information.

If the electrodes 51 and 52 are shaped so that they, for example, gradually increase (or gradually decrease) in size in the moving direction of the moveable body, only one electrode may be required for the sensor.

For such known electrostatic sensors, the size of the electrodes is large. Therefore, the change in capacitance of the electrostatic sensor generated when the moveable body, such as a finger, contacts the sensor is large, and, thus, the sensor is highly sensitive.

However, recent demands for reducing the size of the electrodes of electrostatic sensors and increasing the thickness of the case have arose from the demands for reducing the size and increasing the functionality of input apparatuses. For reduced-size electrostatic sensors, it is difficult to detect an input by contact of the moveable body since the capacitance of the sensor is small.

A typical portable input apparatus intermittently drives input means having an electrostatic sensor in order to reduce the electrical power consumption. Specifically, when the input apparatus is not used and is in a standby mode, a driving pulse (clock signal) for driving the electrostatic sensor is not generated, but, when the input apparatus is put to use, the driving pulse is generated.

When the input apparatus having an electrostatic sensor in a standby mode is started up by a moveable body, such as a finger, contacting the sensor, the time required for start-up is about 300 ms. Thus, the responsiveness for the initial operation of the sensor is not good, making the sensor unsuitable for intermittent driving.

SUMMARY OF THE INVENTION

Embodiments of the present invention provide input means having a reduced-size electrostatic sensor that can precisely detect an input and then output a signal and that has excellent responsiveness and reliability.

Furthermore, embodiments of the present invention provide input means having an electrostatic sensor that starts up from standby mode in an extremely short time, is very responsive and, thus, suitable for intermittent driving, and assures low electrical power consumption.

The input apparatus having an electrostatic sensor according to the present invention comprises the following: clock signal generating means for generating clock signals; delaying means for generating delayed signals by delaying the signal rise time of the clock signal according to the capacitance detected when a human appendage approaches or contacts the electrostatic sensor; and AND means for receiving the clock signal and the delayed signal as input signals and then outputting these signals as an output signal.

For the input apparatus having an electrostatic sensor according to the present invention, the pulse length of the first clock signal generated at the clock signal generating means extends for a length required for obtaining an intended output from the smoothing means when the electrostatic sensor is started up by a human appendage contacting the sensor in a standby mode with no clock signal output.

In this way, the electrostatic sensor can start-up from standby mode in an extremely short time and, thus, will be very responsive and suitable for intermittent driving while consuming consume less electrical power.

Moreover, the input apparatus having an electrostatic sensor according to the present invention comprises the following: clock signal generating means for generating clock signals; delaying means for generating delayed signals by delaying the signal rise time of the clock signal according to the capacitance detected when a human appendage approaches or contacts the electrostatic sensor; AND means for receiving the clock signal and the delayed signal as input signals and then outputting these signals as an output signal;

an analog switch for switching and outputting the output of the AND means with a clock signal; and smoothing means for smoothing and outputting the output of the analog switch.

In this way, the reduced-size electrostatic sensor will precisely detect an input and then output a signal and will have excellent responsiveness and reliability.

BRIEF DESCRIPTION OF THE DRAWINGS

FIGS. 5A, 5B, 5C, 5D and 5E are timing charts showing signals from each part of the circuit shown in FIG. 3;

FIG. 6A is a plan view, and FIG. 6B is an explanatory diagram showing the output signals.

DESCRIPTION OF THE PREFERRED EMBODIMENTS

An embodiment according to the present invention is described in the following.

Figure 1:
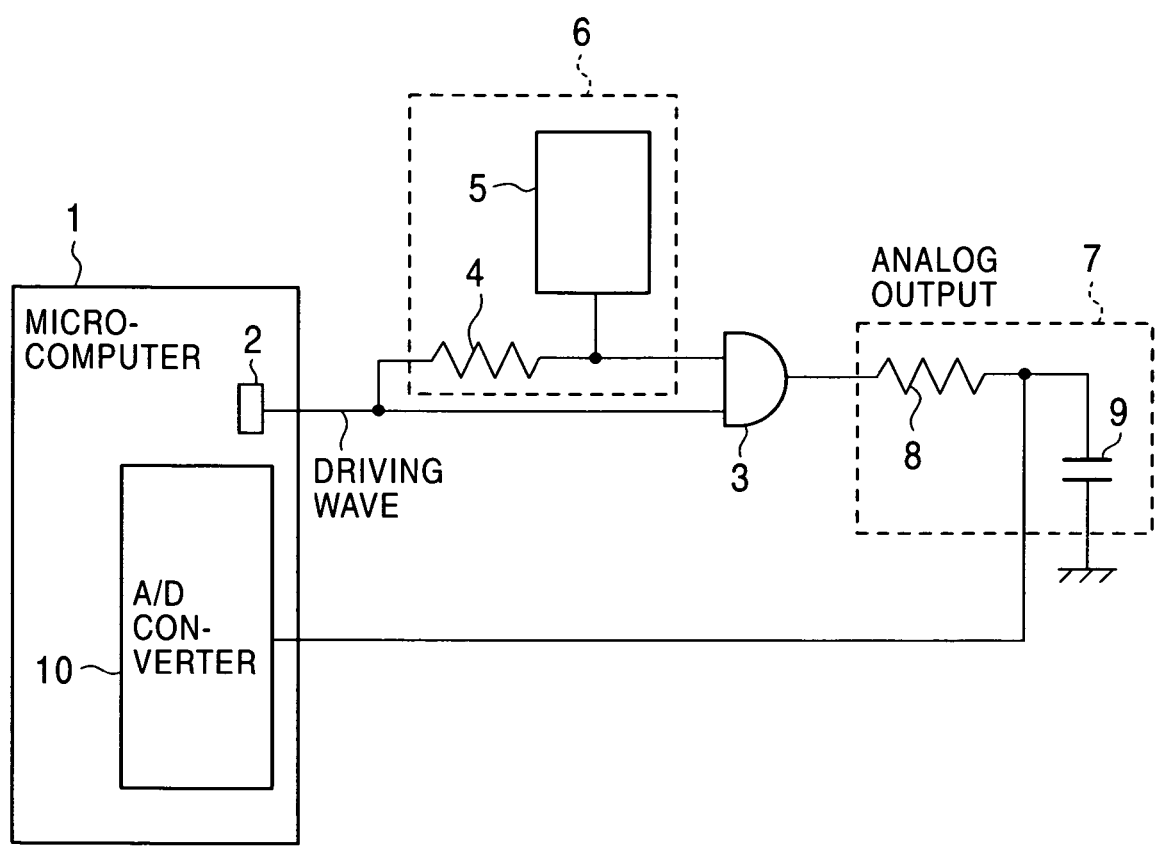
FIG. 1 is a circuit diagram showing a first embodiment of an input apparatus having an electrostatic sensor according to the present invention.

FIG. 1 shows a portable input apparatus that is a first embodiment of an input apparatus having an electrostatic sensor according to the present invention.

As shown in FIG. 1, the portable input apparatus outputs a clock signal, which is a driving wave, from clock signal generating means 2 of a microcomputer 1 built into the portable input apparatus, to an AND circuit 3, which is an AND means, as one of the input signals to the AND circuit 3. The input of the AND circuit 3 is connected to a delaying means 6 composed of a resistor 4 connected in series to the clock signal generating means 2 and an electrostatic sensor 5. The delaying means 6 send a delayed signal, which is a clock signal with a rise time delayed in accordance with the capacitance detected when a human appendage approaches or contacts the electrostatic sensor 5, to the AND circuit 3, as another input signal to the AND circuit 3. The output of the AND circuit 3 is connected smoothing means 7 composed of a resistor 8 and a capacitor 9. The output of the smoothing means 7 is connected in such a way that signals are outputted to an A/D converter 10.

Next, a method for driving the input apparatus shown in FIG. 1 is described by referring to FIG. 2. FIG. 2 is a timing chart of signals from parts shown in FIG. 1.

Figure 2A:
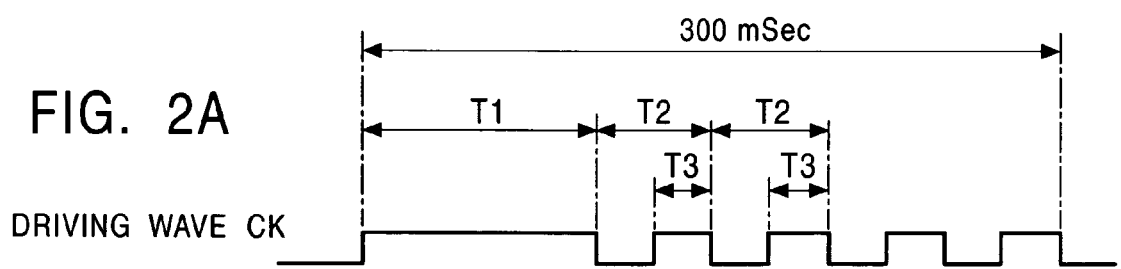
FIGS. 2A and 2B are timing charts showing signals from each part of the circuit shown in FIG. 1.

In the present invention, starting up the electrostatic sensor 5 in a standby mode by touching it with a human finger causes a clock signal CK to be sent to the AND circuit 3 from the clock signal generating means 2 of the microcomputer 1, as shown in FIG. 2A. The first pulse of the clock signal CK extends for a pulse length (T1) required for obtaining an intended output for the smoothing means 7, and the second pulse and the subsequent pulses are regular pulse signals with a predetermined frequency (wherein the period is T2 and the half period is T3).

The first pulse of the clock signal CK is periodically inputted from the delaying means 6, and then an analog output based on a time constant CR, which is determined by the resistance R of the resistor 4 and the capacitance C of the electrostatic sensor 5, is sent to the AND circuit 3.

When the output of the delaying means 6 exceeds a threshold for determining the high or low level of the AND circuit 3, the first pulse of the clock signal is still being outputted. As a result, the AND circuit 3 outputs an AND pulse, which is a logical multiplication output from the AND circuit 3, to the smoothing means 7. The AND pulse from the AND circuit 3 has a long pulse length that has the same period as the first pulse of the clock signal.

Figure 2B:
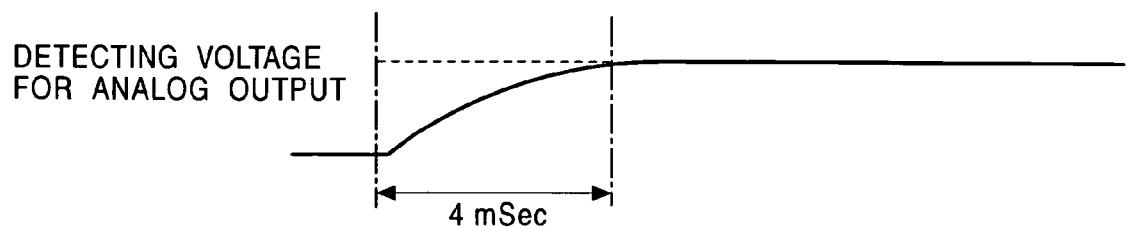

Subsequently, the AND pulse outputted from the AND circuit 3 is smoothened at smoothing means 7 according to the time constant R1.C1 determined by the resistance R1 of the resistor 8 and the capacitance C1 of the capacitor 9. Then, as shown in FIG. 2B, in the duration of the first pulse of the clock signal, the voltage of the output increases to a predetermined detecting voltage and is sent to the A/D converter 10. At the A/D converter 10, the output is converted into a digital value corresponding to the detecting voltage, e.g. a digital value from d0 to d7.

In this embodiment, the pulse length of the first pulse of the clock signal is set to a length (for example, 4 ms) that allows the output of the smoothing means 7 to reach an intended detecting voltage. Therefore, when the electrostatic sensor 5 is switched on, this is detected in an extremely short time, i.e. 4 ms. Then, data manipulation may be performed immediately. The output of the smoothing means 7 after the second pulse of the clock signal becomes constant. Specifically, the detecting voltage differs according to the structure of the electrostatic sensor, such as the size. The detecting voltage, however, becomes constant once the structure is determined. Thus, once the detecting voltage, R1, C1, and the constant is determined, the optimal time for the pulse length T1 of the first pulse of the clock signal can be calculated, and, therefore, the shortest time required for detection can be determined and intermittent driving can be performed to reduce the electrical power consumption. As a result, data input can be performed quickly.

In the following, an example of applying a second embodiment of the input apparatus having an electrostatic sensor according to the present invention to a portable apparatus is described.

Figure 3:
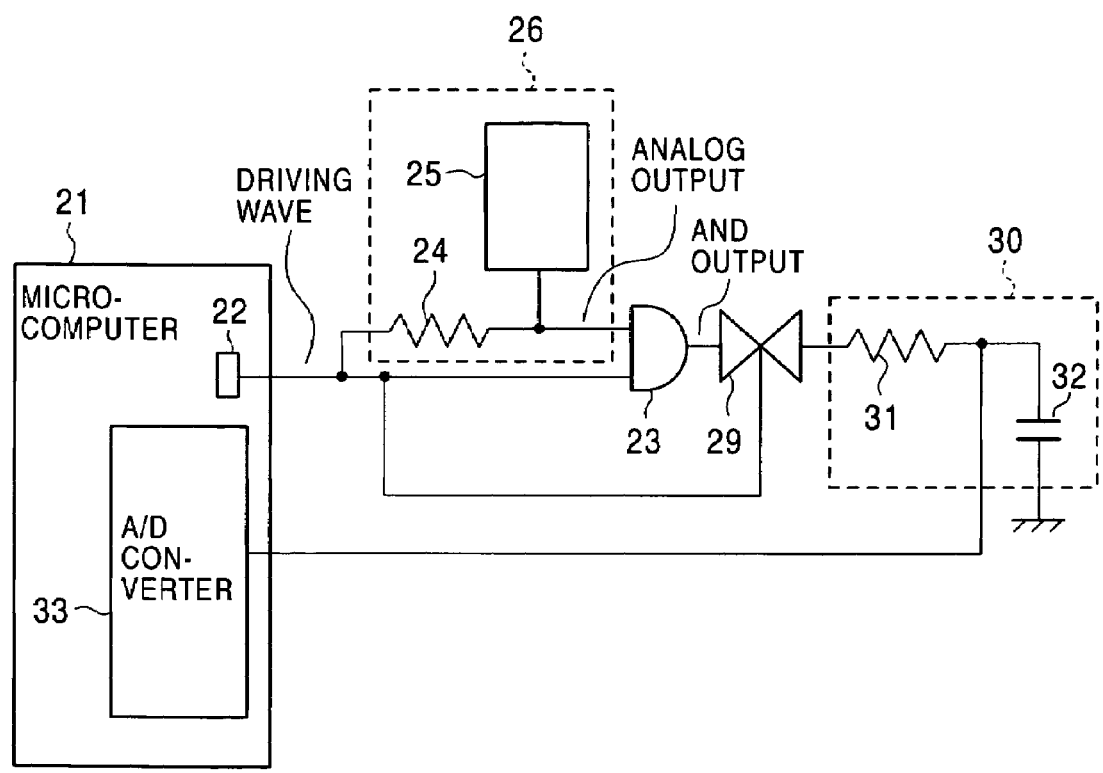
FIG. 3 is a circuit diagram showing a second embodiment of an input apparatus having an electrostatic sensor according to the present invention.
Figure 4:
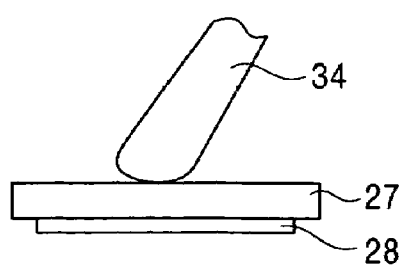
FIG. 4 is a side view of the first embodiment of the electrostatic sensor.
Figure 6A:
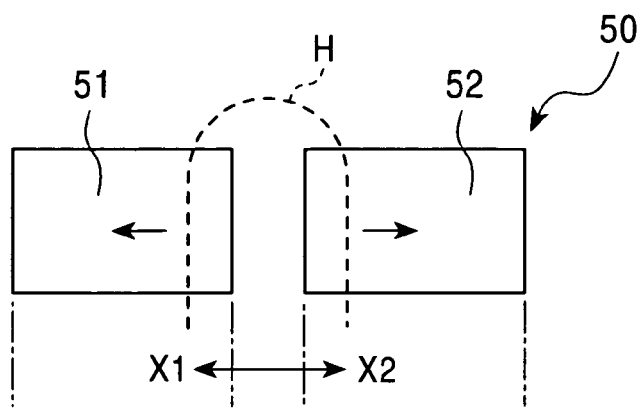
FIGS. 6A and 6B show part of the electrostatic sensor.
Figure 6B:
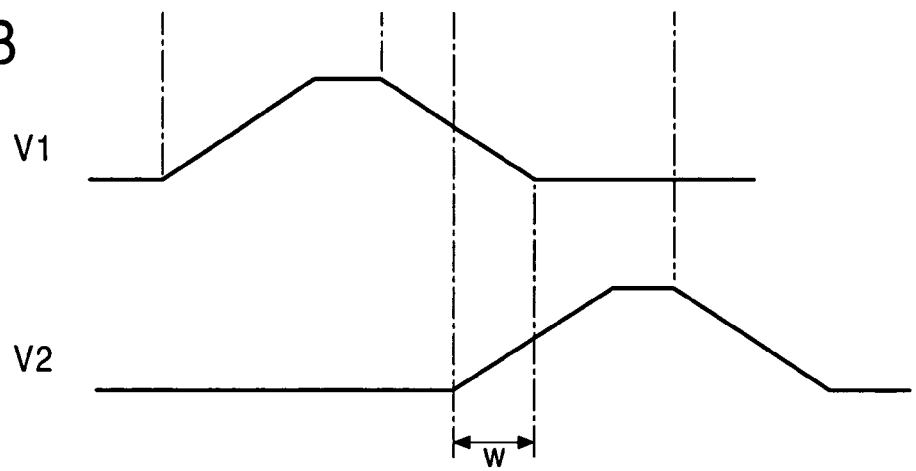
Figure 7:
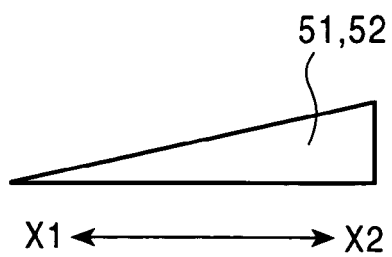
FIG. 7 is an explanatory diagram showing a variation of an electrode of the electrostatic sensor.

As shown in FIG. 3, a clock signal, which is a driving wave, is outputted from clock signal generating means 22 of a microcomputer 21 built into a portable apparatus, to an AND circuit 23 as one of the input signals to the AND circuit 23. The input of the AND circuit 23 is connected to a delaying means 26 composed of a resistor 24 connected in series to the clock signal generating means 22 and an electrostatic sensor 25. The delaying means 26 send a delayed signal, which is a clock signal with a rise time delayed in accordance with the capacitance detected when a human appendage approaches or contacts the electrostatic sensor 25, to the AND circuit 23, as another input signal to the AND circuit 23. The electrostatic sensor 25, as shown in FIG. 4, is composed by attaching an electrode 28 onto the inner surface of a case 27 of the input apparatus. The output of the AND circuit 23 is connected to an analog switch 29, which is switched by the clock signal and outputs the input from the AND circuit 23 by the clock signal. The analog switch 29 may be any type of known analog switch. The output of the analog switch 29 is connected to a resistor 31 and a capacitor 32, which compose smoothing means 30 for smoothing and outputting the output from the analog switch 29. The output of the smoothing means 30 is connected so that it outputs to an A/D converter 33 in the microcomputer 21.

From the clock signal generating means 22 of the microcomputer 21, a clock signal CK, which is a regular pulse signal with a predetermined frequency (wherein the period is T1 and the half period is T2), as shown in FIG. 5A, is output to the AND circuit 23.

When a human appendage is not in contact with the electrostatic sensor 25, an analog output, as shown in FIG. 5B, based on a time constant CR, which is determined by the resistance R of the resistor 24 and the capacitance C of the electrostatic sensor 25, is input to the AND circuit 23 while the clock signal CK goes through the delaying means 26.

By setting the threshold level SL for determining the high and low levels of the AND circuit 23, as shown in FIG. 5B, the logical multiplication of the AND circuit 3 becomes a pulse with a duration of T3, as shown in FIG. 5C.

On the other hand, when the a part of a human body 34 is in contact with the electrostatic sensor 25, an analog output, as shown in FIG. 5D, based on a time constant CR, which is determined by the resistance R of the resistor 24 and the capacitance C of the electrostatic sensor 25, is sent to the AND circuit 23 while the clock signal CK goes through the delaying means 26.

As shown in FIG. 5D, by setting the threshold level SL for determining the high and low levels of the AND circuit 23, the same as in FIG. 5B, the logical multiplication of the AND circuit 23 becomes a pulse with a duration of T4, as shown in FIG. 5E.

Each output from the AND circuit 23, shown in FIGS. 5C and 5E, is sent to the smoothing means 30 by switching the analog switch 29 with the clock signal CK. Then, the output is smoothened based on a time constant C1.R1, which is determined by the resistance R1 of the resistor 31 and the capacitance C1 of the capacitor 32, at the smoothing means 30 and is sent to the A/D converter 33. Then, the output is converted into a digital value.

Since the analog switch 29 is used in this embodiment, the amount of change between the output voltage of the smoothing means 30 for when a human appendage is in contact and not in contact with the electrostatic sensor 25 is determined by formula 1 shown below:

$$V=\{(T3-T4)/T2\}VDD \quad \text{(formula 1)}.$$

Alternatively, the amount of change between the output voltages of the smoothing means 30 for when a human appendage is in contact or not in contact with a known electrostatic sensor 25 without an analog switch 29, as shown in FIG. 3, is determined by formula 2 shown below:

$$V=\{(T3-T4)/T1\}VDD \quad \text{(formula 2)}.$$

When formula 1 and 2 are compared, the change in voltage is greater by (T1/T2) for this embodiment (formula 1) compared to known electrostatic sensors.

Consequently, even if the electrostatic sensor 25 according to this embodiment is restricted to have a small capacitance, it can precisely detect whether or not a human appendage is in contact with the sensor, and, as a result, it has excellent responsiveness and the reliability.

The present invention is not limited to this embodiment; the embodiment may be modified as required.

As described above, the input apparatus having an electrostatic sensor according to the present invention can start-up from standby mode in an extremely short time and, thus, will be very responsive and suitable for intermittent driving while consuming less electrical power and will process information quickly.

Moreover, the reduced-size electrostatic sensor will precisely detect an input and then output a signal and, thus, will have excellent responsiveness and reliability.

What is claimed is:

1. An input apparatus having an electrostatic sensor, comprising:
   clock signal generating means for generating clock signals;
   delaying means for generating delayed signals by delaying signal rise times of the clock signals according to a capacitance detected when a human appendage approaches or contacts the electrostatic sensor;
   AND means for receiving the clock signals and the delayed signals as input signals and outputting the clock and delayed signals as an output signal; and
   smoothing means for smoothing and outputting an output of the AND means,
   wherein the delaying means extends a pulse length of a first clock signal generated at the clock signal generating means to a length required for obtaining an intended output from the smoothing means when the electrostatic sensor is started up by the human appendage contacting the electrostatic sensor in a standby mode with no clock signal output.

2. An input apparatus having an electrostatic sensor, comprising:
   clock signal generating means for generating clock signals;
   delaying means for generating delayed signals by delaying signal rise times of the clock signals according to a capacitance detected when a human appendage approaches or contacts the electrostatic sensor;
   AND means for receiving the clock signals and the delayed signals as input signals and then outputting the clock and delayed signals as an output signal;
   an analog switch for switching and outputting an output of the AND means with a clock signal; and
   smoothing means for smoothing and outputting an output of the analog switch,
   wherein the delaying means extends a pulse length of a first clock signal generated at the clock signal generating means to a length required for obtaining an intended output from the smoothing means when the electrostatic sensor is started up by the human appendage contacting the electrostatic sensor in a standby mode with no clock signal output.

* * * * *